(12) United States Patent
Kim et al.

(10) Patent No.: US 8,383,208 B2
(45) Date of Patent: Feb. 26, 2013

(54) METHOD OF FABRICATING ORGANIC LIGHT EMITTING DEVICE

(75) Inventors: Han-Ki Kim, Suwon-si (KR);
Myung-Soo Huh, Suwon-si (KR);
Myoung-Soo Kim, Suwon-si (KR);
Kyu-Sung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 520 days.

(21) Appl. No.: 11/400,474

(22) Filed: Apr. 6, 2006

(65) Prior Publication Data

US 2006/0228827 A1 Oct. 12, 2006

(30) Foreign Application Priority Data

Apr. 6, 2005 (KR) .................. 10-2005-0028609

(51) Int. Cl.
*H05H 1/24* (2006.01)
*C23C 16/00* (2006.01)
*H05B 3/00* (2006.01)

(52) U.S. Cl. ....................... 427/569; 427/592
(58) Field of Classification Search .......... 427/160–169, 427/248.1–255.7
See application file for complete search history.

(56) References Cited

U.S. PATENT DOCUMENTS

| | | | | |
|---|---|---|---|---|
| 5,441,768 A | * | 8/1995 | Law et al. ..................... | 438/482 |
| 5,916,365 A | * | 6/1999 | Sherman ...................... | 117/92 |
| 5,958,140 A | | 9/1999 | Arami et al. | |
| 6,045,877 A | * | 4/2000 | Gleason et al. ............... | 427/522 |
| 2003/0075273 A1 | * | 4/2003 | Kilpela et al. ........... | 156/345.33 |
| 2003/0143319 A1 | * | 7/2003 | Park et al. ........................ | 427/64 |
| 2005/0028736 A1 | * | 2/2005 | Long ............................. | 118/715 |

FOREIGN PATENT DOCUMENTS

| | | |
|---|---|---|
| CN | 1459126 A | 11/2003 |
| JP | 63-186876 | 8/1988 |
| JP | 64-079376 | 3/1989 |
| JP | 03-214724 | 9/1991 |
| JP | 5-1381 | 1/1993 |
| JP | 05-090247 | 4/1993 |
| JP | 06-314660 | 11/1994 |

(Continued)

OTHER PUBLICATIONS

Dirtu, Daniela, et al; "Thermal decomposition of ammonia. N2H4—an intermediate reaction product", Dec. 2006; Central European Journal of Chemistry; vol. 4, No. 4, 666-673.*

(Continued)

*Primary Examiner* — Michael Cleveland
*Assistant Examiner* — Michael G Miller
(74) *Attorney, Agent, or Firm* — Christie, Parker & Hale, LLP

(57) ABSTRACT

Methods of fabricating an organic light emitting device using plasma and/or thermal decomposition are provided. An insulating layer is formed by reacting first and second radicals. The first radical is formed by passing a first gas through a plasma generating region and a heating body, and the second radical is formed by passing a second gas through the heating body. The methods improve the characteristics of the resulting insulating layer and increase the use efficiency of the source gas by substantially decomposing the source gas. The insulating layer can be a passivation layer formed on an organic light emitting device. The methods use plasma apparatuses such as an inductively coupled plasma chemical vapor deposition (ICP-CVD) apparatuses or plasma enhanced chemical vapor deposition (PECVD) apparatuses.

17 Claims, 3 Drawing Sheets

FOREIGN PATENT DOCUMENTS

| | | |
|---|---|---|
| JP | 63-14660 | 11/1994 |
| JP | 10-261487 | 9/1998 |
| JP | 11-242994 | 9/1999 |
| JP | 2000-323421 | 11/2000 |
| JP | 2001-313272 | 11/2001 |
| JP | 2003-163082 | 6/2003 |
| JP | 2003-273023 | 9/2003 |
| JP | 2005-82888 | 3/2005 |
| KR | 10-2006-0084701 | 7/2006 |

OTHER PUBLICATIONS

Petersen, Eric, et al; "Measurements of High-Temperature Silane Pyrolysis using SiH4 IR emission and SiH2 Laser Absorption"; Nov. 14, 2003 online; J. Phys. Chem A. 2003, 107, 10988-10995.*
TMAL SSG (Trimethylaluminim) MSDS, accessed online Jun. 28, 2012.*
Patent Abstracts of Japan, Publication No. 11-242994, dated Sep. 7, 1999, in the name of Yoshio Himeshima et al.
Patent Abstracts of Japan, Publication No. 2003-273023, dated Sep. 26, 2003, in the name of Kouichirou Shinraku et al.
Japanese Office Action issued Apr. 28, 2009 for corresponding Japanese Patent Application No. 2006-102144.
Korean Patent Registration Gazette issued May 17, 2007 for corresponding Korean priority Application No. 10-2005-0028609.
Patent Abstracts of Japan, Japanese Publication No. 05-001381 Published Jan. 8, 1993.
Patent Abstracts of Japan, Japanese Publication No. 10-261487 Published Sep. 29, 1998.
Patent Abstracts of Japan, Japanese Publication No. 2000-323421, Published Nov. 24, 2000.
Patent Abstracts of Japan, Japanese Publication No. 2001-313272, Published Nov. 9, 2001.
Patent Abstracts of Japan, Japanese Publication No. 2003-163082, Published Jun. 6, 2003.
Patent Abstracts of Japan, Japanese Publication No. 2003-273023, Published Sep. 26, 2003.
Patent Abstracts of Japan, Japanese Publication No. 2005-082888, Published Mar. 31, 2005.
Korean Patent Abstracts, Korean Publication No. 1020060084701 A, Published Jul. 25, 2006.
Chinese Patent Registration Gazette dated Jul. 22, 2009, for corresponding Chinese application 200610072619.9.
Japanese Office action dated Oct. 6, 2009, for corresponding Japanese application 2006-102144.

* cited by examiner

METHOD OF FABRICATING ORGANIC LIGHT EMITTING DEVICE

CROSS-REFERENCE TO RELATED APPLICATION

This application claims priority to and the benefit of Korean Patent Application No. 10-2005-28609, filed Apr. 6, 2005 in the Korean Intellectual Property Office, the entire content of which is incorporated herein by reference.

FIELD OF THE INVENTION

The present invention relates to a method of fabricating an organic light emitting device. More particularly, the invention is directed to a method of fabricating an organic light emitting device in which a hybrid chemical vapor deposition apparatus uses plasma and/or heat to form an insulating passivation layer on a substrate on which an organic light emitting device is formed.

BACKGROUND OF THE INVENTION

Plasma atmospheres are widely used in thin film related fields such as chemical vapor deposition, etching, and surface treatment processes because plasma atmospheres increase the reaction efficiency of these processes and enable performance of the processes under good conditions.

Various methods of forming plasma may be used depending on purpose of the plasma. Therefore, various plasma forming apparatuses are being actively developed. Recently, a high-density plasma processing apparatus capable of increasing process efficiency has been used in semiconductor manufacturing processes. Such high-density plasma processing apparatuses may include electron cyclotron resonance (ECR) plasma processing apparatuses which use microwave sources for the resonance frequency, helicon plasma processing apparatuses which use helicon or whistler waves, inductively coupled plasma processing apparatuses which use high-temperature, low-pressure plasma, and the like.

FIG. 1 is a cross-sectional view of an inductively coupled plasma chemical vapor deposition (ICP-CVD) apparatus employing both an inductively coupled plasma processing apparatus and a chemical vapor deposition apparatus.

Referring to FIG. 1, the ICP-CVD apparatus includes a chamber 101 formed of an insulating material and capable of maintaining a vacuum, and an antenna 102 on an upper end of the chamber 101 for generating inductively coupled plasma. The antenna 102 is connected to a first power supply 103.

A gas injection port 105 for injecting gas 104 into the chamber 101 is disposed below the antenna 102. The gas injection port 105 generally comprises a showerhead for uniformly supplying the gas 104 to the plasma formed by the antenna 102.

A chuck 107 for mounting a substrate 106 to be processed by the ICP-CVD apparatus is disposed in the chamber 101. The chuck 107 may be used to heat, cool or fix the substrate 106 to the chamber 101. A second power supply 108 is connected to the chuck 107. The second power supply 108 may be used to heat the chuck 107 or to allow the chuck 107 to function as an electrode.

A door 109 is attached to a sidewall of the chamber 101 to provide the substrate 106 access to the interior or exterior of the chamber 101. An exhaust port 111, including a vacuum pump 110 for exhausting air or gas from the chamber 101, is also attached to the sidewall.

The chemical vapor deposition apparatus deposits an insulating layer using only plasma, yielding an imperfectly decomposed source gas. As a result, the use efficiency of the source gas may decrease. In addition, since the insulating layer contains a great deal of hydrogen, it is difficult to obtain a high quality insulating layer.

SUMMARY OF THE INVENTION

In one embodiment of the present invention, a method of fabricating an organic light emitting device is provided which is capable of forming an insulating layer on a substrate. The insulating layer is formed by decomposing a gas requiring relatively high energy for decomposition using a plasma decomposition method and a thermal decomposition method, and by decomposing a gas requiring relatively low energy for decomposition using only a thermal decomposition method.

In one exemplary embodiment of the present invention, a method of fabricating an organic light emitting device includes first preparing a substrate including a first electrode, an organic layer including at least an emission layer, and a second electrode. An insulating layer is then formed on the second electrode by reacting first and second radicals. The first radical is formed by passing a first gas through a plasma generating region and a heating body and the second radical is formed by passing a second gas through the heating body. Power may be supplied to the heating body to heat the heating body.

BRIEF DESCRIPTION OF THE DRAWINGS

The above and other features of the present invention will be better understood with reference to the following detailed description when considered in conjunction with the attached drawings in which.

DETAILED DESCRIPTION OF THE INVENTION

Figure 1:
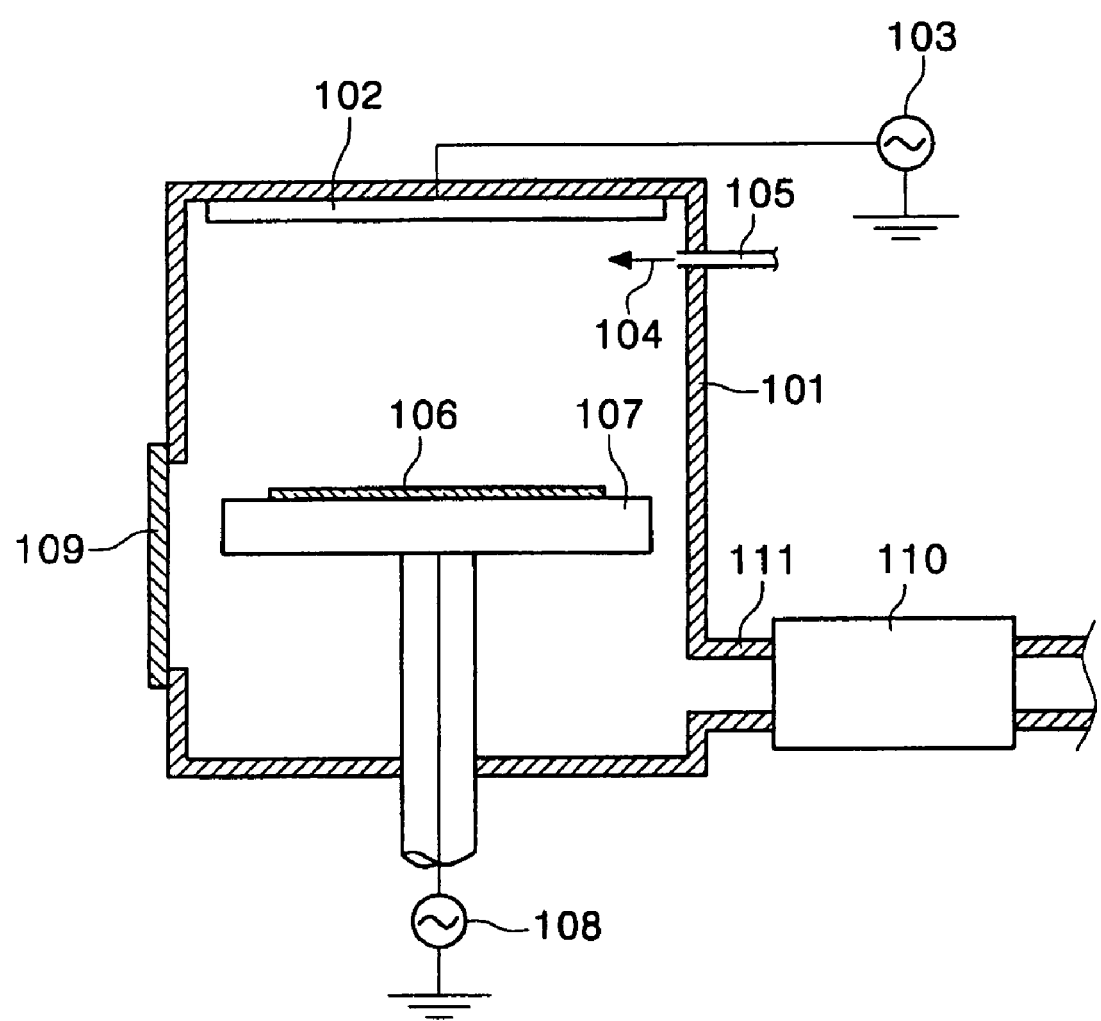
FIG. 1 is a cross-sectional view of a prior art chemical vapor deposition apparatus.

The present invention will now be described with reference to the accompanying drawings, in which exemplary embodiments of the invention are shown. The drawings are illustrative in nature and are not to be construed as limiting the present invention. In the drawings, the thickness of layers and regions may be exaggerated for ease of illustration. In addition, like reference numerals designate like elements throughout the specification.

Figure 2:
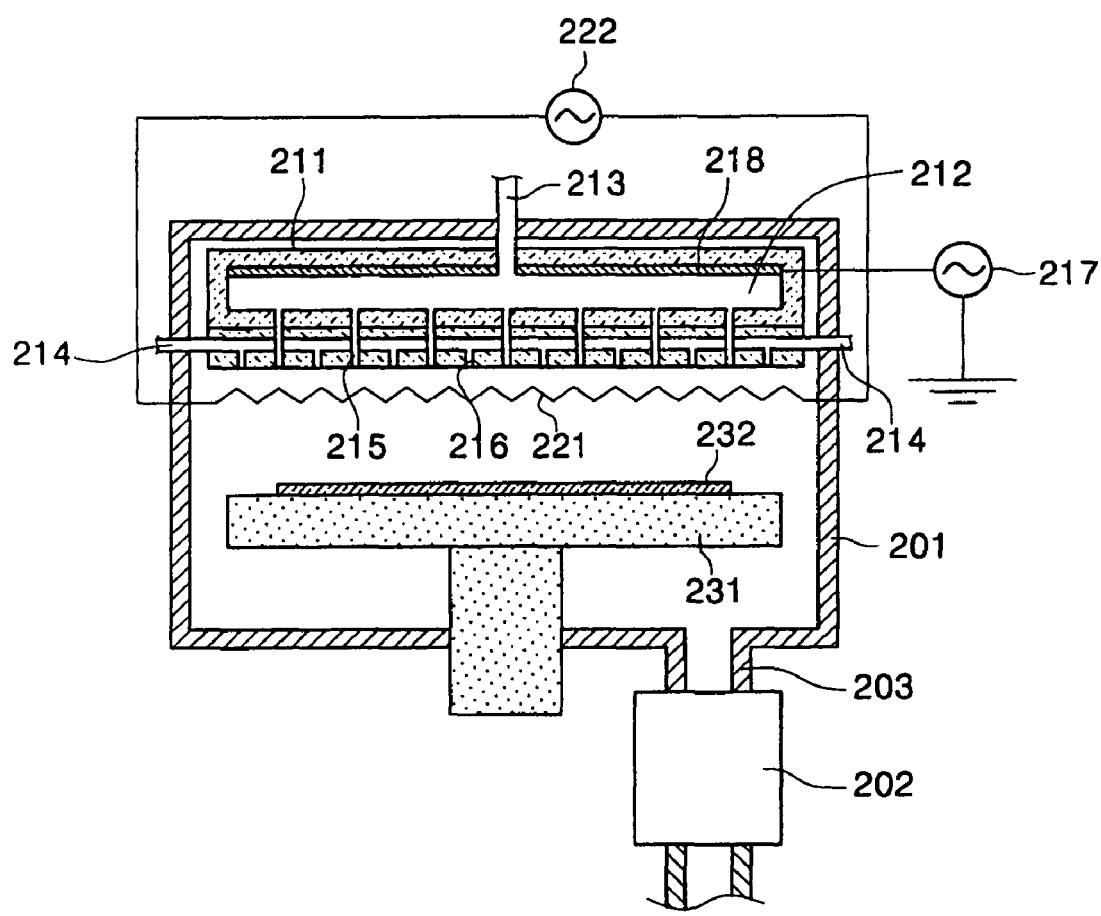
FIG. 2 is a cross-sectional view of a chemical vapor deposition apparatus for fabricating an organic light emitting device in accordance with one exemplary embodiment of the present invention.

FIG. 2 is a cross-sectional view of a chemical vapor deposition apparatus for use in a method of fabricating an organic light emitting device in accordance with one exemplary embodiment of the present invention. The chemical vapor deposition apparatus can simultaneously perform plasma and thermal decomposition.

Referring to FIG. 2, the chemical vapor deposition apparatus includes a chamber 201, a showerhead 211, a heating body 221, and a chuck 231. Each of the showerhead 211, heating body 221 and chuck is disposed in a predetermined region of the chamber 201. The chamber 201 functions to hermetically seal an inner space from the external environment. An exhaust port 203, including a vacuum pump 202 for maintaining vacuum in the chamber 201, is connected to the chamber 201.

In addition, the showerhead 211 includes a cavity 212 (i.e., a plasma generating region), a first gas injection port 213, and a second gas injection port 214. The first gas injection port 213 is disposed on one surface of the showerhead 211, and a first nozzle 215 is connected to the cavity 212. A second nozzle 216 is connected to the second gas injection port 214 and both the second nozzle 216 and second gas injection port 214 are connected to the other surface of the showerhead 211. An electrode 218 is connected to an external power supply 217 disposed on one surface of the cavity 212. The cavity 212 is formed in the showerhead 211 to isolate the plasma generated by the showerhead 211 in the cavity 212, thereby preventing the plasma from affecting the other regions of the chamber 201.

The heating body 221 is connected to an second external power supply 222.

A substrate 232 may be mounted on a surface of the chuck 231.

The showerhead 211 includes first and second gas injection ports 213 and 214 for injecting gas. The first gas injection port 213 is used to inject a first gas requiring relatively high energy for decomposition, and the second gas injection port 214 is used to inject a second gas requiring relatively low energy for decomposition.

As used herein, "energy for decomposition" means the energy required to decompose a gas molecule injected into the chemical vapor deposition apparatus into gas atoms or ions. For example, silane ($SiH_4$) gas having a structure including one silicon atom and four hydrogen atoms bonded to each other, the "energy for decomposition" may be referred to as the energy required to decompose the hydrogen from the silane ($SiH_4$) gas.

When the injected gases are ammonia ($NH_3$) gas and silane gas, the ammonia gas requires a higher energy for decomposition than the silane gas, and the silane gas requires a lower energy for decomposition than the ammonia gas. Accordingly, the ammonia gas is the first gas and the silane gas is the second gas. As illustrated by this example, the first and second gases are determined by comparing the energies required for decomposition of the gases. After comparison, the gas requiring the higher energy for decomposition becomes the first gas, and the gas requiring the lower energy for decomposition becomes the second gas.

The first gas is injected through the first gas injection port 213 into the cavity 212 (i.e. the plasma generating region). The cavity 212 includes plasma generated by power supplied from the first power supply 217 to an electrode 218 mounted on an inner surface of the cavity 212, and the plasma partially decomposes the first gas.

In addition, the first gas is injected into the chamber 201 through a plurality of first nozzles 215 installed on a surface of the showerhead 211 facing the chuck 231.

Further, as the first gas is injected through the first nozzles 215 and passes by the heating body 221 disposed between the showerhead 211 and the chuck 231, the first gas that is not decomposed by the plasma is substantially decomposed by the heating body 221 to form a first radical. The heating body 221 includes a filament formed of tungsten so that heat having a temperature of at least about 1000° C. is generated by the power applied from the second external power supply 222 to decompose the first gas. In one embodiment the heating body 221 produces heat having a temperature of about 1500° C. or more.

The second gas is injected through the second gas injection port directly into the chamber 201 through the second nozzles 216 installed on the surface of the showerhead 211 facing the chuck 231. The second gas passes around the heating body 221 and is decomposed, thereby forming a second radical.

A predetermined amount of first gas is injected into the first gas injection port 213 and is decomposed while passing through the cavity 212. The first gas is then injected into the chamber 201 through the first nozzles 215 and decomposed again while passing through the heating body 221 to form a first radical. The second gas is injected into the second gas injection port 214 and directly into the chamber 201 through the second nozzles 216. The second gas is decomposed by the heating body 221 to form a second radical. After decomposition of the first and second gases, the first and second radicals react to form a thin layer on the substrate 232. When the first and second gases are ammonia and silane, respectively, a silicon nitride layer may be formed on the substrate 232. Since ammonia and silane gases contain hydrogen, these gases cannot be perfectly decomposed by a typical chemical vapor deposition apparatus. In particular, the ammonia gas requires high energy for decomposition. Therefore, hydrogen is present in the resulting silicon nitride layer. When the silicon nitride layer contains hydrogen, the layer may generate moisture when the hydrogen bonds to oxygen. This moisture may poorly influence other devices, which the silicon nitride layer is designed to protect. Accordingly, the hydrogen content of the silicon nitride layer should be minimized. By decomposing the ammonia gas twice, gas is substantially decomposed into nitrogen and hydrogen, thereby minimizing the hydrogen content of the silicon nitride layer.

In one embodiment, the first nozzles 215 are arranged on the surface of the showerhead 211 at uniform intervals. If necessary, the intervals between the first nozzles 215 may be adjusted to increase uniformity of the insulating layer formed on the substrate 232. The second nozzles 216 may also be uniformly arranged similar to the arrangement of the first nozzles 215, and if necessary, the second nozzles 216 may be irregularly arranged. In one embodiment, the first and second nozzles 215 and 216 are both uniformly arranged to uniformly mix the first and second gases.

Hereinafter, an exemplary embodiment of a process of forming an insulating layer on a substrate using plasma and thermal vapor deposition methods in accordance with the present invention will be described.

As described with reference to FIG. 2, a substrate 232 is loaded on a chuck 231 and placed in a hybrid chemical vapor deposition apparatus including a showerhead and a heating body in accordance with the present invention.

Figure 3:
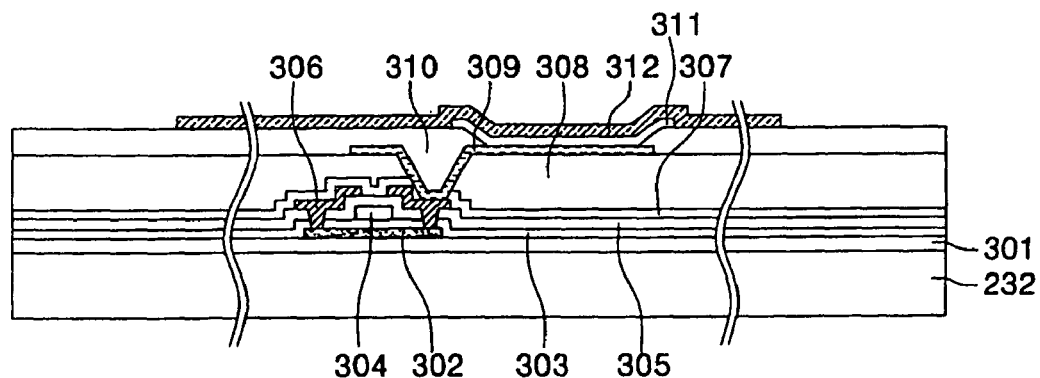
FIG. 3 is a cross-sectional view of a substrate before formation of an insulating layer for use in a method of fabricating an organic light emitting device in accordance with one exemplary embodiment of the present invention.

Referring to FIG. 3, the substrate 232 may include an organic light emitting device including a buffer layer 301, a semiconductor layer 302, a gate insulating layer 303, a gate electrode 304, an interlayer insulating layer 305, source and drain electrodes 306, a passivation layer 307, a planarization layer 308, a first electrode 309, a pixel defining layer 310, an organic layer 311 including at least an organic emission layer, and a second electrode 312. In this embodiment, the insulating layers of the organic light emitting device (i.e. the buffer layer 301, the gate insulating layer 303, the interlayer insulating layer 305, the passivation layer 307, the planarization layer 308 and the pixel defining layer 310) may be formed using the hybrid chemical vapor deposition apparatus described above.

A gas in the chamber 201 is exhausted using a vacuum pump 202 to reach a vacuum pressure of $5\times10^{-6}$ torr or less. In one embodiment, a temperature of a wall of the chamber is maintained at greater than 120° C. in order to prevent the insulating layer from forming in the wall of the chamber rather than substrate, which may occur when the temperature of the chamber is too low.

After injecting an inert gas into the first gas injection port 213, power is applied to the electrode 218 to form plasma in the cavity 212. The inert gas may include He, Ne, Ar, or the like for generating the plasma. The flow rate of the inert gas may range from about 1 to about 1000 sccm. The plasma is generated by RF power supplied from the first power supply 211 and ranging in intensity from about 100 to about 3000 W.

Electric power is then applied to the heating body 221 to increase the temperature of the heating body 221 to about 1500° C. or greater.

The first gas requiring relatively high energy for decomposition (such as ammonia gas and/or nitrogen ($N_2$) gas) is then injected through the first gas injection port 213. The flow rate of ammonia gas ranges from about 1 to about 500 sccm, and the flow rate of nitrogen gas ranges from about 1 to about 1000 sccm. The first gas is injected through the first gas injection port 213 into the cavity 212 of the showerhead 211, which contains plasma for decomposing the first gas. The first gas is primarily decomposed by the plasma and then injected into the chamber 201 through the first nozzles 215. The first gas then passes the heating body 221 where it is secondarily decomposed by the heating body 221 which is heated to a temperature of about 1500° C. or greater, thereby forming a first radical.

The second gas requiring relatively low energy for decomposition (such as silane gas) is then injected through the second gas injection port 214. The flow rate of the silane gas ranges from about 1 to about 100 sccm. The second gas is injected through the second gas injection port 214 directly into the heating body 221, and does not pass through the cavity. The second gas is decomposed by the heating body 221 to form a second radical.

Figure 4:
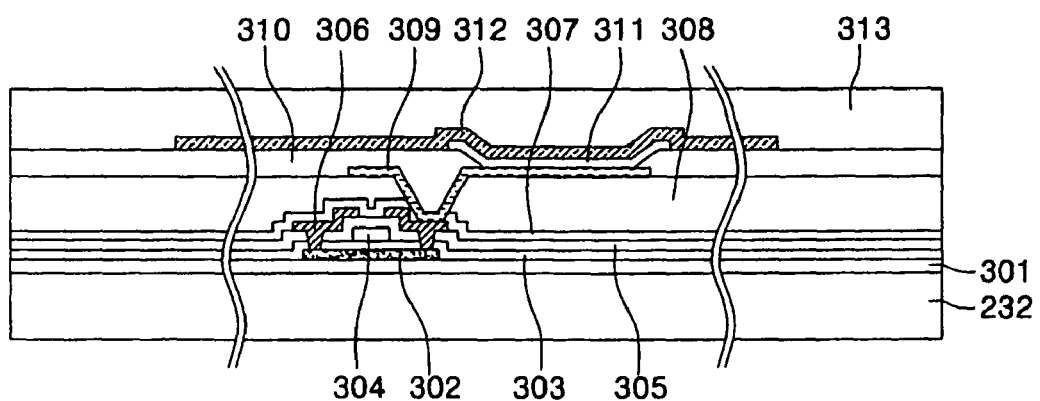
FIG. 4 is a cross-sectional view of a substrate including an insulating layer for use in a method of fabricating an organic light emitting device in accordance with one exemplary embodiment of the present invention.

Next, the first and second radicals react to form an insulating layer to be deposited on the substrate. The insulating layer forms a passivation layer 313 on the substrate, as shown in FIG. 4.

The passivation layer 313 is an insulating layer containing little hydrogen. Generally, organic light emitting devices may be seriously damaged by moisture. Though moisture that penetrates through or is generated from the interior or exterior can be removed by an absorbent material, oxygen that penetrates through or is generated from the interior or exterior penetrates into the organic light emitting device and bonds to the hydrogen remaining in the organic light emitting device, thereby generating moisture. This moisture seriously damages the organic light emitting device. In the prior art, a great deal of hydrogen remains in the insulating layer. Though the organic light emitting device emits light using an organic layer including at least an emission layer, the organic layer is very susceptible to moisture, and the presence of moisture dramatically decreases the performance of the organic layer. Accordingly, the penetration of moisture into the organic light emitting device should be prevented.

Since the passivation layers 313 formed according to the present invention contain little hydrogen, moisture penetration is substantially prevented even when oxygen penetrates the passivation layer 313. As a result, the poor influences of moisture on the organic light emitting device is substantially removed. The passivation layers 313 of the present invention contain little or no hydrogen because the first gas, which is difficult to decompose, is decomposed twice, once through a plasma method and once through a thermal method, so that the hydrogen in the first gas is substantially removed to form a first radical for use in forming the passivation layer 313.

As described above, according to one embodiment of the present invention, a source gas is substantially decomposed to obtain a good quality insulating layer. Accordingly, the methods of fabricating organic light emitting devices according to the present invention prevent the organic light emitting devices, and in particular the organic layer, from being damaged due to moisture. In addition, the methods according to the present invention maximize the use efficiency of the source gas.

While certain exemplary embodiments of the present invention have been described and illustrated herein, it will be clear to those of ordinary skill in the art that various changes in form and detail may be made to the described embodiments without departing from the spirit and scope of the present invention as defined in the appended claims.

What is claimed is:

1. A method of fabricating an organic light emitting device, comprising:
   preparing a substrate comprising:
      a first electrode,
      an organic layer comprising at least an emission layer, and
      a second electrode;
   placing the substrate in a chamber;
   preparing a plasma in a cavity of a showerhead in communication with the chamber by injecting an inert gas into a plasma generation region in the cavity and applying power to the cavity;
   passing a first gas through the plasma;
   passing the first gas by a heating filament positioned between the showerhead and the substrate, wherein passing the first gas through the plasma and by the heating filament forms a first radical;
   passing a second gas by the heating filament positioned between the showerhead and the substrate without passing the second gas through the plasma, wherein passing the second gas by the heating filament forms a second radical; and
   reacting the first and second radicals to form an insulating layer on the second electrode.

2. The method according to claim 1, wherein the insulating layer is a passivation layer.

3. The method according to claim 1, wherein the first gas first passes through the plasma, and then passes by the heating filament, thereby forming the first radical.

4. The method according to claim 1, wherein the cavity and the heating filament are contained in the chamber, the substrate being loaded in the chamber and the first and second gases are supplied to the chamber.

5. The method according to claim 1, wherein the showerhead is in the chamber.

6. The method according to claim 1, wherein the first gas requires an energy for decomposition higher than an energy for decomposition required by the second gas.

7. The method according to claim 1, wherein the first gas is selected from the group consisting of ammonia gas and nitrogen gas.

8. The method according to claim 1, wherein the second gas comprises silane gas.

9. The method according to claim 1, wherein the heating filament comprises tungsten.

10. The method according to claim 1, wherein the insulating layer comprises a silicon nitride layer.

11. The method according to claim 1, wherein the heating filament is heated to a temperature of at least about 1000° C.

12. The method according to claim 1, wherein the heating filament is heated to a temperature of about 1500° C. or greater.

13. A method of fabricating an organic light emitting device, comprising:
preparing a substrate comprising:
a first electrode,
an organic layer comprising at least an emission layer, and
a second electrode;
placing the substrate in a chamber;
preparing a plasma in a cavity of a showerhead in communication with the chamber by injecting an inert gas into a plasma generation region in the cavity and applying power to the cavity;
passing a first gas through the plasma to decompose the first gas and then passing the first gas by a heating filament positioned between the showerhead and the substrate and heated to a temperature of at least about 1000° C. to further decompose the first gas, wherein the decomposed first gas forms a first radical;
passing a second gas by the heating filament positioned between the showerhead and the substrate without passing the second gas through the plasma to decompose the second gas, wherein the decomposed second gas forms a second radical; and
reacting the first and second radicals to form an insulating layer on the second electrode.

14. The method according to claim 13, wherein the cavity and the heating filament are contained in the chamber, the substrate being loaded in the chamber and the first and second gases are supplied to the chamber.

15. The method according to claim 13, wherein the showerhead is in the chamber.

16. The method according to claim 13, wherein the first gas requires an energy for decomposition higher than an energy for decomposition required by the second gas.

17. The method according to claim 13, wherein the heating filament is heated to a temperature of about 1500° C. or greater.

* * * * *

UNITED STATES PATENT AND TRADEMARK OFFICE
CERTIFICATE OF CORRECTION

| | | |
|---|---|---|
| PATENT NO. | : 8,383,208 B2 | Page 1 of 1 |
| APPLICATION NO. | : 11/400474 | |
| DATED | : February 26, 2013 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1776 days.

Signed and Sealed this
Eighteenth Day of November, 2014

Michelle K. Lee
*Deputy Director of the United States Patent and Trademark Office*